United States Patent [19]

DuLac

[11] Patent Number: 5,550,986
[45] Date of Patent: Aug. 27, 1996

[54] DATA STORAGE DEVICE MATRIX ARCHITECTURE

[75] Inventor: Keith B. DuLac, Derby, Kans.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 539,663

[22] Filed: Oct. 5, 1995

Related U.S. Application Data

[63] Continuation of Ser. No. 124,653, Sep. 7, 1993, abandoned.

[51] Int. Cl.$^6$ .................................................. G06F 13/00
[52] U.S. Cl. ............................................ 395/280; 395/312
[58] Field of Search ...................................... 395/200, 280, 395/312

[56] References Cited

U.S. PATENT DOCUMENTS

| | | | |
|---|---|---|---|
| 4,195,344 | 3/1980 | Yamakazi | 364/200 |
| 4,633,431 | 12/1986 | Bar | 364/400 |
| 4,797,882 | 1/1989 | Maxemchuk | 370/60 |
| 4,821,170 | 4/1989 | Bernick et al. | 364/200 |
| 4,933,933 | 6/1990 | Dally et al. | 370/60 |
| 5,041,971 | 8/1991 | Carvey et al. | 364/200 |
| 5,124,987 | 6/1992 | Milligan et al. | 371/10.1 |
| 5,168,572 | 12/1992 | Perkins | 395/200 |
| 5,181,017 | 1/1993 | Frey, Jr. et al. | 395/200 |
| 5,223,968 | 6/1993 | Stringer et al. | 370/60 |
| 5,317,735 | 5/1994 | Schomberg | 395/325 |
| 5,319,638 | 6/1994 | Lin | 370/60 |

*Primary Examiner*—Jack B. Harvey
*Assistant Examiner*—David A. Wiley
*Attorney, Agent, or Firm*—Wayne P. Bailey; James M. Stover

[57] ABSTRACT

A data storage system comprising a matrix of intelligent storage nodes interconnected to communicate with each other via a network of busses. The network of busses includes a plurality of first busses for conducting data from and to a corresponding plurality of host system processors and a plurality of second busses, each one of the second busses intersecting with each one of the first busses. The nodes are located at each intersection. The storage nodes each include a data storage device, such as a magnetic disk drive unit, a processor and buffer memory, whereby the node processor controls the storage and retrieval of data at the node as well as being capable of coordinating the storage and retrieval of data at other nodes within the network.

15 Claims, 2 Drawing Sheets

DATA STORAGE DEVICE MATRIX ARCHITECTURE

This is a continuation of application Ser. No. 08/124,653 filed Sep. 7, 1993, now abandoned.

The present invention relates to data storage systems and, more particularly, to a data storage system architecture which enables the distribution of protected storage tasks among a matrix of data storage devices.

BACKGROUND OF THE INVENTION

Disk array storage systems include a plurality of hard disk drives, such as the 5¼ or 3½ inch disk drives currently used in personal computers and workstations, which operate in parallel and appear to the host system as a single large disk drive. Numerous disk array design alternatives are possible, incorporating a few to many disk drives. Several array alternatives, each possessing different attributes, benefits and shortcomings, are presented in an article titled "A Case for Redundant Arrays of Inexpensive Disks (RAID)" by David A. Patterson, Garth Gibson and Randy H. Katz; University of California Report No. UCB/CSD 87/391, December 1987. The article, incorporated herein by reference, discusses disk arrays and the improvements in performance, reliability, power consumption and scalability that disk arrays provide in comparison to single large magnetic disks.

Complex storage management techniques are required in order to coordinate the operation of the multitude of data storage devices within an array to perform read and write functions, parity generation and checking, data restoration and reconstruction, and other necessary or optional operations. Array operation can be managed by a dedicated hardware controller constructed to control array operations, i.e., a hard array architecture, or through software routines executed by the host computer system, i.e., a software array architecture.

A hardware array improves data storage reliability and availability, and increases system performance without modifying user applications. A hardware controller removes many of the data storage tasks from the host system processor, permitting greater accommodation of other applications and tasks by the host system.

A software architecture allows existing system hardware and storage devices to be utilized as an array storage system. The increasing speed and power of advanced computer systems provides performance that is competitive with many hardware array products. A software array architecture can deliver this functionality at a lower cost of implementation than a hardware array. Greater configuration flexibility may also be provided. However, the host processor remains burdened with data storage tasks.

The hardware and software array alternatives discussed above provide improvements in performance, reliability, power consumption, scalability and capacity in comparison to single large magnetic disks. However, coincident with these improvements there exists a need to store and manage ever increasing amounts of data, and to utilize the host processor, array controller and storage devices in the most efficient and effective manner. Additional improvements to data storage systems are desired to better utilize the speed and power of current and next generation computer systems, particularly multiple processor computer systems.

OBJECTS OF THE INVENTION

It is therefore an object of the present invention to provide a new and useful data storage system which overcomes many of the disadvantages associated with existing storage options.

It is another object of the present invention to provide a new and useful data storage system which includes a network of interconnected nodes, each node having a storage device and a processor possessing the capability for coordinating data storage and retreival operations at several nodes within the network.

It is yet another object of the present invention to provide such a data storage system wherein multiple storage operations may be performed concurrently, each operation being coordinated by a different node within the network.

SUMMARY OF THE INVENTION

There is provided, in accordance with the present invention, a data storage system comprising a network of nodes interconnected to communicate with each other via a plurality of busses. Each node includes a data storage device, such as a magnetic disk drive unit, connected to receive data from and provide data to at least one of the plurality of busses, and a node processor connected to the bus for controlling the storage and retrieval of data at the node. The node processor is further capable of controlling the storage and retrieval of data at data storage devices associated with additional nodes within the network through communications between node processor and the additional nodes via the plurality of busses.

In the described embodiment, the plurality of busses includes a plurality of first busses for conducting data from and to a corresponding plurality of host system processors and a plurality of second busses, each one of the second busses intersecting with each one of the first busses. The network nodes are provided at each intersection. Each one of the nodes includes a disk storage device connected to receive data from and provide data to the first and the second busses associated with the node, and a processor connected to the first and second busses associated with the node for controlling the storage and retrieval of data at the node as well as being capable of controlling the storage and retrieval of data at other nodes within the network.

The above and other objects, features, and advantages of the present invention will become apparent from the following description and the attached drawings.

DETAILED DESCRIPTION OF THE PREFERRED EMBODIMENT

Figure 1:
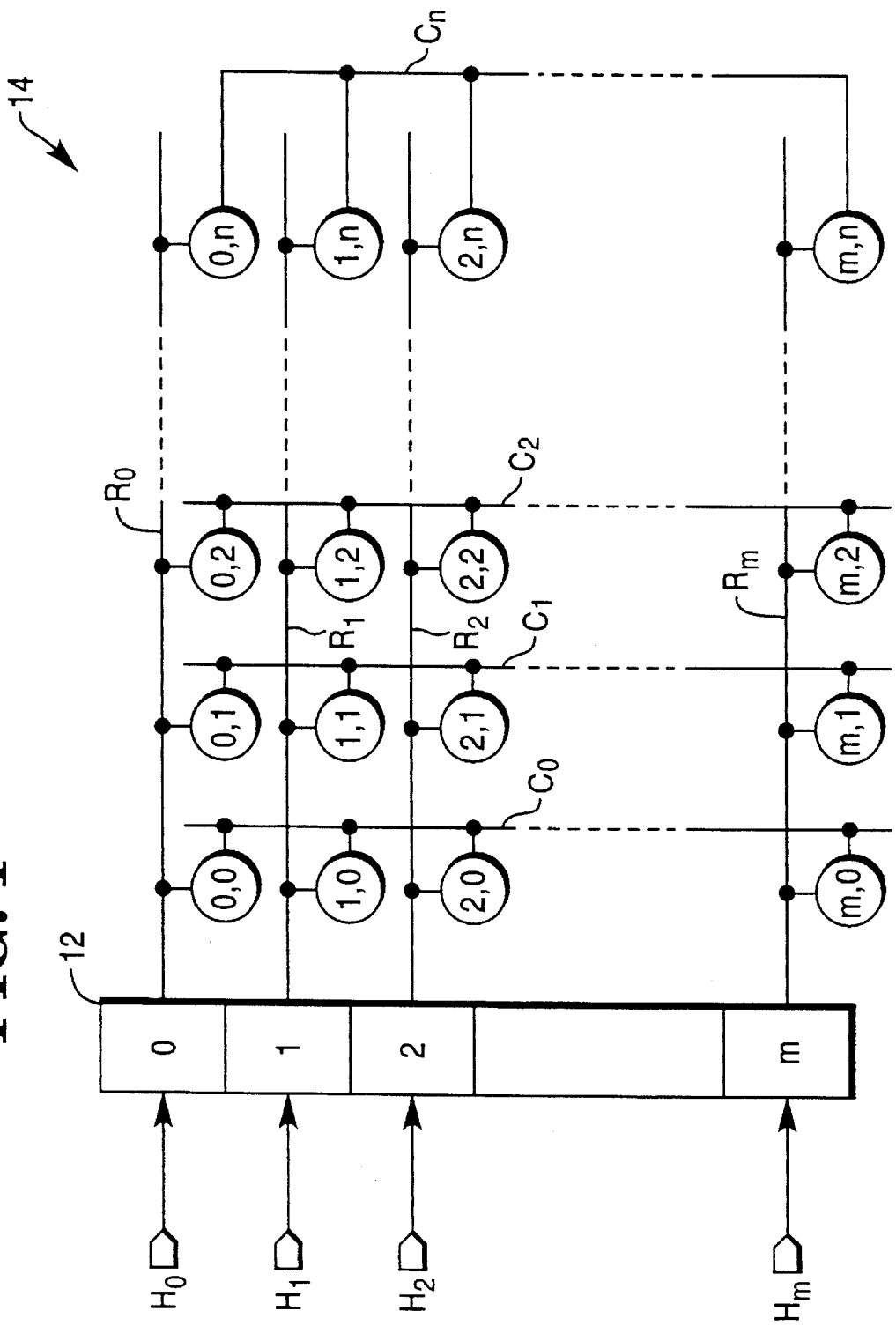
FIG. 1 is a diagrammatic illustration of a data storage system including a plurality of disk drives and inexpensive processors located within a matrix network, constructed in accordance with the present invention.
Figure 2:
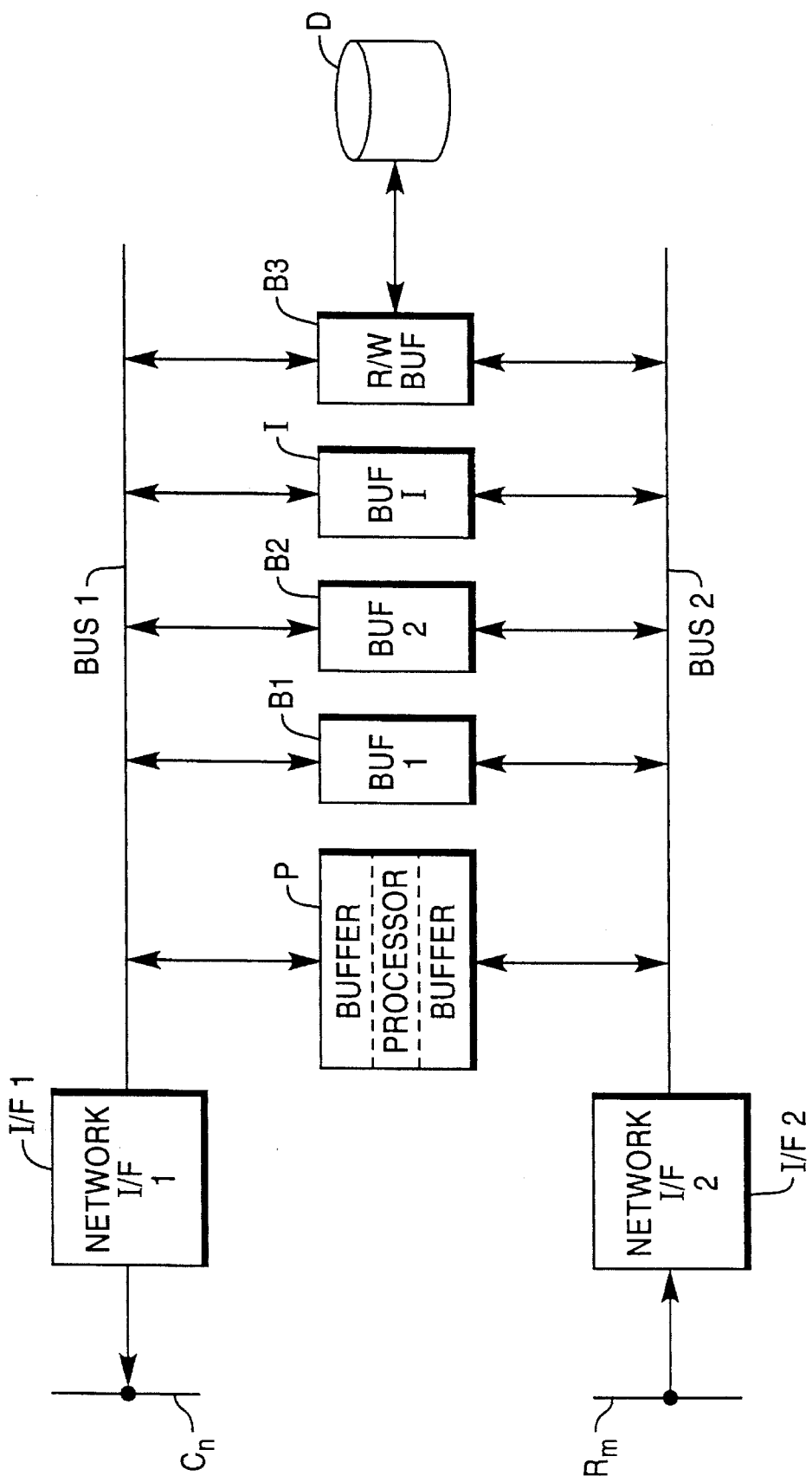
FIG. 2 is a block diagram showing the processor, disk drive, and associated elements located within each node of the matrix network illustrated in FIG. 1.

Referring now to FIGS. 1 and 2, there is seen a data storage system in accordance with the present invention. The architecture shown in FIG. 1 includes a host processor connection block 12 providing connection to one or more host system processors, not shown. The host processors are identified by reference numerals $H_0$, $H_1$, $H_2$, ... $H_m$. Connection block 12 couples host processors $H_0$, $H_1$, $H_2$, ... $H_m$ to a network 14 of data storage nodes. Network 14 includes several busses, $R_0$ through $R_m$, arranged in rows, each bus connecting one of host processors $H_0$ through $H_m$ with a group of storage nodes. Network 14 further includes several busses, $C_0$ through $C_n$, arranged in columns. A node is formed at every intersection between a row and column bus. The nodes are identified by pairs of coordinates, the first coordinate referring to the number of the row bus to which it connects, and the second coordinate identifying the column bus to which the node connects. The network includes nodes from (0, 0), at the intersection of busses $R_0$ and $C_0$, through (m, n), at the intersection of busses $R_m$ and $C_n$.

$H_0$ in the configuration shown is connected directly to storage nodes (0, 0) through (0, n) through bus R0. In addition, $H_0$ is provided access to all the storage nodes on bus $C_0$, i.e., nodes (1, 0) through (m, 0) by passing through node (0, 0). Nodes (0, 1) through (0, n) similarly provide access for processor $H_0$ to the nodes on busses $C_1$ through $C_n$, respectfully. Each one of host processors $H_1$ through $H_m$ has direct access to all the storage nodes on busses $R_1$ through $R_m$, respectively, and access through interconnecting nodes to all the storage nodes on network 14.

Host processor connection block 12 may include logic for executing group array algorithms, such as the RAID algorithms that are necessary for issuing I/O operations, handling error exception conditions, and performing data reconstruction, when a storage device in network 14 fails. Other functions of the logic included in connection block 12 may include diagnostic and group algorithm initialization executed in response to input provided by a system administration. In a high performance configuration, a host processor connection block will exist for every row bus ($R_0$ through $R_m$) that is shown in node network 14. The high performance configuration allows multiple I/O commands and data to flow over the attached row busses simultaneously. In a lower performance, lower cost configuration command and data flow over one row bus.

Each of storage nodes (0, 0) through (m, n) includes a storage device, node processor, buffers and interface logic as shown in FIG. 2. A block diagram showing the processor, disk drive, and associated elements located within node (m, n) of network 14 is shown.

Node (m, n) is seen to include an interface I/F 1 to column bus $C_n$, a second interface I/F 2 to row bus $R_m$, an inexpensive processor P, data buffers B1, B2, I and B3, and a storage element D, such as a Head Disk Assembly (HDA) for storing and retrieving data. Node processor P and data buffers B1, B2, I and B3 are connected to interface I/F 1 and thereby to network bus $C_n$ by a node bus identified as BUS 1. A second bus, identified as BUS 2, provides connection between node processor P and data buffers B1, B2, I and B3 and interface I/F 2, which thereby provides connection to network bus $R_m$. Read/write buffer B3 also provides the node connection to storage element D. Nodes (0, 0) through (m, n) are similarly constructed.

Node processor P, in a conventional sense, controls the network protocols, buffer management, error recovery and storage media control such as head positioning, data encoding/decoding and defect handling. A typical example of the network node could be a Small Computer System Interface (SCSI) disk drive.

In operation, array storage requests are received from one or more host processors and directed to designated nodes within network 14 for execution. An exemplary array operation could be for $H_0$ to issue a RAID level 5 write operation. The command is formed in a packetized mode for serial connections, or in handshake mode for parallel connections, and issued to appropriate nodes over bus $R_0$. $H_0$ could issue a write to any desired node (0,0) to (0,n) residing on bus $R_0$. The node that receives the command will be referred to in the discussion which follows as the primary node. Remaining network nodes will be referred to as secondary nodes. The command contains information about secondary nodes that will be involved in subsequent read/write operations spawned by the primary node. Spawned operations are necessary to complete the RAID level 5 write command. The primary node upon receiving a command takes responsibility for the operation if no error conditions occur. The primary node will report status conditions to the appropriate host processors for irregular conditions.

The data storage system described above permits the distribution of the compute power necessary to execute the array algorithms and functions to the nodes of a generalized network. The network can consist of intelligent disk drives such that the array algorithms and most common functions are executed at the array nodes.

The host system is relieved of many of the array storage operations. Additionally, several array requests may be executed concurrently, each request being processed by a different primary node. The system thereby realizes increased performance beyond the capabilities of a storage system employing a single hardware controller.

The two main attributes of the described system are:
1. Increase in performance because each node contains sufficient processor power to relieve either the Host processor or the H/W array processor; and
2. Relieves the bandwidth bottleneck of the I/O connection since multiple I/O paths can be used to connect the array nodes.

The invention, therefore is very adaptable to various network architectures and provides improvements in network storage performance. This is due to the compute power which is available independent of host system application load. The invention is also intended to improve the incremental capacity and the reliability of computer networks.

It is important to note that network 14 can be a generalized switching arrangement that would provide a multitude of paths to the individual storage devices coupled to the network.

Listed below are example scenarios to show the execution of the exemplary operations by the storage system according to the present invention.

| Operation Number | Host | Primary Node | Secondary Node | Operation |
|---|---|---|---|---|
| 1 | H0 | (0,1) | (1,1) | Write |
| 2 | H1 | (1,0) | — | Read |
| 3 | H2 | (2,2) | (1,2) | Write |

Operation 1:

$H_0$ issues a RAID level 5 write to node (0,1). $H_0$ passes commands and data to node (0, 1 ) processor P and buffer B1, respectively, over network bus $R_0$ and node bus BUS 1. Node (0, 1) processor P decodes the command and determines a read-modify-write cycle is necessary involving secondary node (1,1). Node (0, 1) processor P issues a read command with node (0, 1) identified as the source to node (1,1). The command is communicated to node (1, 1) via bus $C_1$.

Simultaneously processor P in node (0,1) issues a read to HDA device D in node (0,1) to read old data from HDA device D into Buffer I.

Node processor P in node (1,1) receives the read command via bus $C_1$, interface block I/F 1, and node bus BUS 1. Node (1,1) processor P decodes the received read command and retrieves read data from HDA device D into buffer I. Node (0,1) and (1,1) complete their respective reads asynchronously. When the reads are complete, node (0,1) contains new data in buffer B1 and old data in buffer I. Node (1,1) contains old parity in its buffer I. Node (1,1) informs node (0,1) that old parity data is in buffer. Node (0,1) reads old parity data over column bus $C_1$ into node (0,1) buffer B2. Node (0,1) now has new data, old data and old parity in its buffer.

To complete the RAID 5 write operation, node processor (0,1) orders an exclusive-OR of the data stored within buffers B1, B2 and I to generate the new parity data. The new parity is placed in buffer I and readied for transmission to node (1,1) for parity update. Simultaneously, node (0,1) writes the new data from buffer B1 to buffer B3 for writing to storage device D. Node (0,1) issues a normal write command of new parity from buffer I.

Node (1,1) informs node (0,1) that parity write is complete and, in turn, when node (0,1) completes write of new data, informs host processor $H_0$ that the RAID level 5 write is complete.

Operation 2:

Host processor $H_1$ issues a normal read to node (1,0) over row bus $R_1$. Upon completion of the read, node (1,0) reports over bus $R_1$ to processor $H_1$ that the operation has completed.

Operation 3:

Operation 3 occurs identical to operation 1 except command and data is passed over row bus $R_2$ and column bus $C_2$ and report operation complete messages provided to host $H_2$ over bus $R_2$.

Operations 1, 2 and 3 may be performed concurrently.

As shown by the scenarios described above, the architecture enables multiple concurrent operations that distributes the RAID algorithms over the array of nodes. The nodes act as peers and operate in a dynamic client/server mode. This invention facilitates expansion of nodes in both row and column directions. Such expansion permits improvement in performance and capacity without impacting the host processor performance.

The node operation is generalized and could be implemented so that each node can manage as a primary or secondary mode and communicate over a multiplicity of channels.

It can thus be seen that there has been provided by the present invention a data storage system which provides increased performance beyond the capabilities of a host system managed storage system or a storage system employing a single hardware controller. The system described above permits the execution of multiple storage operations concurrently, each operation being coordinated by a different node within the storage network.

This architecture is scalable by design and may be expanded by the addition of nodes in both the row and column direction. In addition, the architecture is not limited to use with magnetic disk drive devices. It can be used to provide RAID technology on sequential access devices (e.g. QIC tapes, DAT tapes, etc.) as well as other direct access devices (e.g., optical disks and media changers) and robotic media changer storage devices. The system can be connected to a single host processor or may be interconnected with several host processors within a multiple processor computer system.

Although the presently preferred embodiment of the invention has been described, it will be understood that various changes may be made within the scope of the appended claims.

What is claimed is:

1. A data storage system comprising:

a plurality of nodes including a first node, a second node, and a third node;

a plurality of first busses, at least one of said first busses for conducting data from and to a corresponding host system processor; and a plurality of second busses;

wherein each one of said plurality of nodes connects with a different pairing of one of said first busses with one of said second busses;

each one of said plurality of nodes including:
    a data storage device connected to receive data from and provide data to the first and second busses associated with said one of said plurality of nodes; and
    a node processor connected to said first and second busses associated with said one of said plurality of nodes for controlling the storage and retrieval of data at said data storage device and for receiving a first command from a host system relating to one of storage and retrieval of data in said data storage system and developing a second command from said first command that is different from said first command for controlling one of storage and retrieval of data at said data storage device associated with at least one other node of said plurality of nodes through communications between said node processor and said at least one other node, thereby distributing the control of the storage and retrieval of data in said data storage system from a host system to said plurality of nodes.

2. The data storage system according to claim 1, wherein:

said additional nodes comprise nodes connected to the second data bus associated with said one of said plurality of nodes.

3. The data storage system according to claim 1, wherein:

at least one of said second busses conducts data from one of said first, second, and third nodes to each of the others of said first, second, and third nodes without conducting data through any node before said data is received by said each of the others of said first, second, and third nodes.

4. The data storage system according to claim 1, wherein:

said first command relates to storing data from a host system to said data storage system; and said second command relates to retrieving old parity information from said at least one other node.

5. The data storage system according to claim 1, wherein:

a number of commands, including said second command, are developed by said node processor based on said first command and in which said number of commands depends upon the manner in which said data is stored in said data storage system.

6. The data storage system according to claim 5, wherein:

said number of commands is related to the number of said plurality of nodes in which data is stored.

7. A data storage system comprising:

a network of nodes connected together via a plurality of first busses and a plurality of second busses, each one of said nodes being connected to one of said plurality of first busses and one of said plurality of second busses, each one of said nodes including:
    a data storage device connected to receive data from and provide data to said one of said plurality of first and second busses associated with said one of said nodes; and a node processor connected to said one of said plurality of first and second busses associated with said one of said nodes for controlling the storage and retrieval of data at said data storage device and at data storage devices associated with other of said nodes;

said network of nodes including:

a first node for receiving a first command from a host system relating to one of storage and retrieval of data in said data storage system and for developing a second command from said first command that is different from said first command for controlling one of storage and retrieval of data at said data storage device associated with a second node; and a third node for receiving a third command from a host system relating to one of storage and retrieval of data within said data storage system and for developing a fourth command from said third command that is different from said third command, said second command, and said first command for controlling one of storage and retrieval of data at said data storage device associated with a fourth node, wherein said first and third nodes concurrently control said second and fourth nodes, respectively, thereby providing increased performance for storage and retrieval operations between a host system and said data storage system.

8. A data storage system comprising:

a network of nodes including a first node, a second node, and a third node, said nodes being interconnected to communicate with each other via a plurality of busses;

each one of said nodes including:

a data storage device connected to receive data from and provide data to at least one of said plurality of busses; and a node processor connected to said at least one of said busses for controlling the storage and retrieval of data at said data storage device and at data storage devices associated with other nodes of said plurality of nodes through communications between said node processor and said other nodes, for receiving first data from a host system for storage in said data storage system, for dividing said first data into a plurality of second data for storage on said other nodes, wherein each of said plurality of second data is different from said first data, and for providing said second data to said other nodes for storage thereby distributing said first data across said other nodes.

9. The data storage system according to claim 8, wherein said plurality of busses comprises:

a plurality of first busses for conducting data from and to a corresponding plurality of host system processors; and a plurality of second busses, each one of said plurality of second busses intersecting with each one of said plurality of first busses;

said nodes being located at the intersections of said first busses with said second busses.

10. The data storage system according to claim 9, wherein within each one of said nodes:

said data storage device is connected to receive data from and provide data to the first and the second busses associated with said one of said nodes; and said node processor is connected to said first and second busses associated with said one of said nodes for controlling the storage and retrieval of data at said data storage device.

11. The data storage system according to claim 8, wherein:

at least one of said plurality of busses conducts data from one of said first, second, and third nodes to each of the others of said first, second, and third nodes without conducting data through any node before said data is received by said each of the others of said first, second, and third nodes.

12. A method for communicating data between a host processor and a data storage system comprising a network of a plurality of nodes connected together via a plurality of first busses and a plurality of second busses; each one of said nodes being connected to one of said plurality of first busses and one of said plurality of second busses; each one of said plurality of nodes including a data storage device connected to receive data from and provide data to said one of said first and the second- busses associated with said one of said plurality of nodes; and a node processor connected to said one of said first and second busses associated with said one of said plurality of nodes for controlling the storage and retrieval of data at said data storage device and other nodes of said plurality of nodes through communications between said node processor and said other nodes; said method comprising the steps of:

selecting a first selected node for receiving a first command relating to one of storage and retrieval of data within said data storage system from a host processor connected to one of said plurality of first busses;

controlling the operation of nodes connected to said second bus associated with said first selected node by said node processor of said first selected node developing a second command from said first command that is different from said first command and providing said second command to nodes connected to said second bus associated with said first selected node, thereby distributing the control of the storage and retrieval of data within said data storage system from the host system to said plurality of nodes.

13. The method according to claim 12, further comprising the steps of:

selecting a second selected node for receiving a third command relating to one of storage and retrieval of data within said data storage system from a host processor connected to one of said plurality of first busses;

controlling the operation of nodes connected to said second bus associated with said second selected node by said node processor of said second selected node developing a fourth command from said third command that is different from said third command and providing said fourth command to nodes connected to said second bus associated with said second selected node, wherein said step of controlling the operation of nodes associated with said first selected node and said step of controlling the operation of nodes associated with said second selected node are performed concurrently, thereby providing increased performance when communicating data between a host processor and said data storage system.

14. A method for transferring data between a host processor and a matrix of data storage nodes, said matrix of data storage nodes including a first bus connecting said host processor to a first and a second data storage node, a second bus connecting said first data storage node to a first plurality of data storage nodes, and a third bus connecting said second data storage node to a second plurality of data storage nodes;

each data storage node in said matrix including a data storage device and control logic for controlling the storage and retrieval of data for said matrix of data storage nodes, said method comprising the steps of:

selecting said first data storage node connected to said first bus for receiving first data from said host processor for storage in said first plurality of data storage nodes connected to said second bus transferring said first data from said host processor to said first data storage node;

dividing said first data into a plurality of second data, wherein each of said plurality of second data is different from said first data; and transferring said plurality of second data from said first data storage node to said first plurality of data storage nodes so that said first data storage node distributes said first data across said first plurality of data storage nodes.

15. The method according to claim 14, further comprising the steps of:

selecting said second data storage node for receiving third data from said host processor for storage in said second plurality of data storage nodes connected to said third bus;

dividing said third data into a plurality of fourth data, wherein each of said plurality of fourth data is different from said third data, said second data, and said first data; and transferring said plurality of fourth data from said second data storage node to said second plurality of data storage nodes so that said second data storage node distributes said third data across said second plurality of data storage nodes;

wherein said step of transferring each of said plurality of second data and said step of transferring each of said plurality of fourth data are performed concurrently thereby providing increased performance when transferring data between a host processor and said matrix of data storage nodes.

\* \* \* \* \*